United States Patent
Fang et al.

(10) Patent No.: US 7,167,056 B2
(45) Date of Patent: Jan. 23, 2007

(54) HIGH PERFORMANCE ANALOG CHARGE PUMPED PHASE LOCKED LOOP (PLL) ARCHITECTURE WITH PROCESS AND TEMPERATURE COMPENSATION IN CLOSED LOOP BANDWIDTH

(75) Inventors: Lieyi Fang, Plano, TX (US); Asit Shankar, Richardson, TX (US); Lars Risbo, Copenhagen (DK)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/955,064

(22) Filed: Sep. 30, 2004

(65) Prior Publication Data

US 2006/0071716 A1    Apr. 6, 2006

(51) Int. Cl.
  *H03K 3/03*    (2006.01)
  *H03B 5/12*    (2006.01)
  *H03L 7/093*    (2006.01)
(52) U.S. Cl. ............................ 331/57; 331/17; 331/167
(58) Field of Classification Search .................. 331/57, 331/167, 117 R, 17
See application file for complete search history.

(56) References Cited

U.S. PATENT DOCUMENTS 6,084,480 A * 7/2000 Uneme ........................ 331/17
6,469,585 B1 * 10/2002 Dai et al. .................... 331/57
6,611,177 B2 * 8/2003 Takenaka et al. ............ 331/57
6,825,731 B2 * 11/2004 Hasegawa .................... 331/57
6,930,562 B2 * 8/2005 Takinami et al. ........ 331/117 R
2003/0048145 A1 * 3/2003 Albon et al. ............ 331/177 V
2003/0071691 A1 * 4/2003 Boerstler et al. ............. 331/57

OTHER PUBLICATIONS

Wang et al., "Low Phase Noise SiGe Voltage-controlled Oscillators for Wireless Applications",☐☐Microwave Journal, Feb. 2002, pp. 84, 86, 88, 91, 93, 95, 96, and 99 (8 pages).*

* cited by examiner

*Primary Examiner*—Robert Pascal
*Assistant Examiner*—James Goodley
(74) *Attorney, Agent, or Firm*—Alan K. Stewart; W. James Brady; Frederick J. Telecky, Jr.

(57) ABSTRACT

The present invention achieves technical advantages as a high performance analog charge pumped phase locked loop (PLL)(10) with process and temperature compensation in closed loop bandwidth. The PLL reduces the variation in bandwidth and stability by making the product $K_{VCO}*I_{CP}$ independent of process and temperature variation. The PLL achieves a higher performance than existing PLL architectures, achieving a high dynamic range up to at least 110 dB, such that a PWM class-D amplifier is realizable with this PLL. The PLL has a constant bandwidth and damping factor while using an analog charge pump (16).

14 Claims, 2 Drawing Sheets

US 7,167,056 B2

HIGH PERFORMANCE ANALOG CHARGE PUMPED PHASE LOCKED LOOP (PLL) ARCHITECTURE WITH PROCESS AND TEMPERATURE COMPENSATION IN CLOSED LOOP BANDWIDTH

FIELD OF THE INVENTION

The present invention is generally related to frequency synthesizer circuits, mainly phase-locked loop circuits whose applications include high speed clock generation for digital class-D amplifiers.

BACKGROUND OF THE INVENTION

Digital class-D amplifiers are the trend for audio power amplifiers because of their high efficiency and good sound quality. A conventional digital class-D amplifier consists of a digital PWM modulator and power switches. The digital PWM modulator is usually clocked by a high frequency clock. The dynamic range of this PWM modulator is limited by the phase noise and jitter of the clocks used in the modulator. Therefore, high performance PLL's are essential to achieve high dynamic ranges in digital class-D amplifiers.

The outputs of the PWM modulator typically switch at a frequency of a few hundred kilohertz. This frequency is called the switching frequency. For a high dynamic range, the phase noise of the clock used in the PWM modulator at an offset frequency equal to the switching frequency must be minimized. Hence, new architecture and approaches are needed to achieve the high performance.

Differential control circuits are extensively used in high performance phase locked loops to improve supply and substrate noise. Fully differential charge pumps are often used. In many conventional PLL designs, the voltage controlled oscillator (VCO) itself is usually controlled by a single ended signal, requiring a differential-to-single-ended bias circuit (D2S). However, the bias circuit coming after the loop filter adds intrinsic noise to the VCO, resulting in high jitter. The D2S can be bypassed if the VCO is controlled by a differential signal. This requires that the controlling transistors of the VCO providing the differential signal be complementary in nature.

SUMMARY OF THE INVENTION

The present invention achieves technical advantages as a high performance analog charge pumped phase locked loop (PLL) with process and temperature compensation in closed loop bandwidth. The PLL of the present invention has reduced variation in bandwidth and stability by making the product $K_{VCO}*I_{CP}$ independent of process and temperature variation. The PLL of the present invention achieves a higher performance than existing PLL architectures, achieving a high dynamic range up to at least 110 dB, such that a PWM class-D amplifier is realizable with this PLL. The PLL has a constant bandwidth and damping factor while using an analog charge pump.

DETAILED DESCRIPTION OF THE PREFERRED EMBODIMENT

For good common mode and supply rejection, the common mode voltage of the differential control signal should track process, temperature, and DC supply variations.

Loop bandwidth and damping factor are also key parameters of PLL's. An accurate loop bandwidth is critical for incoming phase and jitter reduction. Good damping factor is crucial for stability.

The loop bandwidth of a charge pump PLL can be expressed approximately as:

$$\omega_o = \frac{I_{CP} K_{VCO} R}{2\pi M} \quad (1)$$

The damping factor of a charge pump PLL ($2^{nd}$ order transfer function approximation) is given by:

$$\xi = \frac{R}{2} \sqrt{\frac{C_1 K_{VCO} I_{CP}}{2\pi M}} \quad (2)$$

$I_{CP}$ is the charge pump current. $K_{VCO}$ is the frequency sensitivity of the VCO. R and $C_1$ are loop filter parameters. M is the clock divider ratio. For high performance PLL's used in audio applications, R and $C_1$ are usually external components since very low bandwidths are required.

Typically, $I_{CP}$ and $K_{VCO}$ are process and temperature dependent. In order to reduce the variation in bandwidth and stability, according to the present invention, the product $K_{VCO}*I_{CP}$ is made relatively independent of process and temperature variations.

Figure 1:
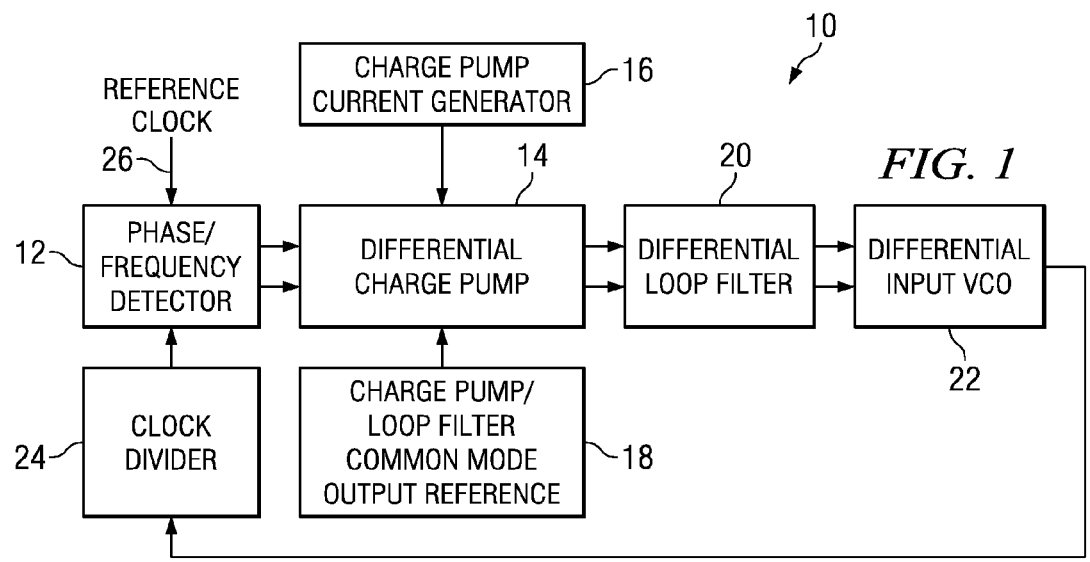
FIG. 1 is a block diagram of one embodiment of the PLL according to the present invention; comprising a analog phase locked loop using differential circuitry.

FIG. 1 shows at 10 a top level block diagram for a typical analog phase locked loop of the present invention. The VCO, loop filter and charge pump are each implemented using differential circuitry. The phase/Frequency detector is shown at 12, differential charge pump at 14, charge pump loop filter at 18, charge pump current generator at 16, differential loop filter at 20, differential input VCO at 22, and clock divider at 24. The reference clock provided at 26 to detector 12 is preferably either a crystal oscillator or an external clock. The external clock can have poor phase noise performance, therefore to achieve high performance out of the PLL, a low closed loop bandwidth is necessary.

Figure 2:
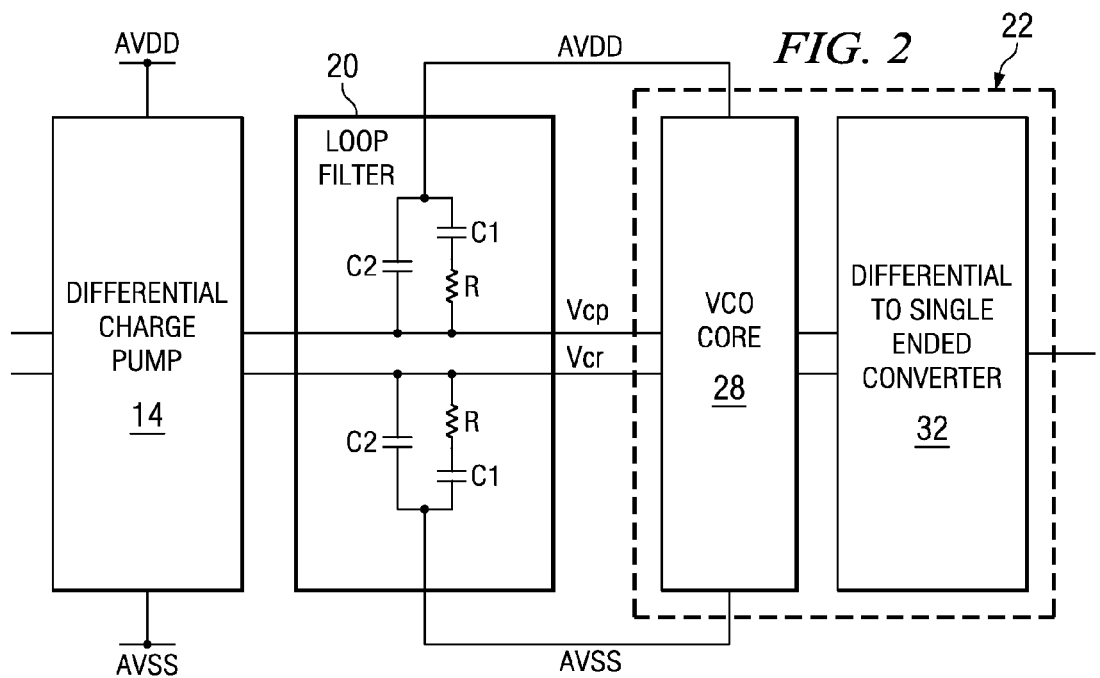
FIG. 2 is a block diagram of the VCO and differential loop filter shown in FIG. 1 showing one set of differential loop filter components referred to the positive power supply (AVDD) and the other set is referred to the negative power supply (AVSS)

FIG. 2 shows a block diagram of the differential loop filter 20 and the VCO 22. The loop filter 22 is external of VCO 22 and has a low closed loop bandwidth providing reduction of the incoming clock noise and jitter. Note that one set of filter components is referred to the positive power supply (AVDD).

Figure 3A:
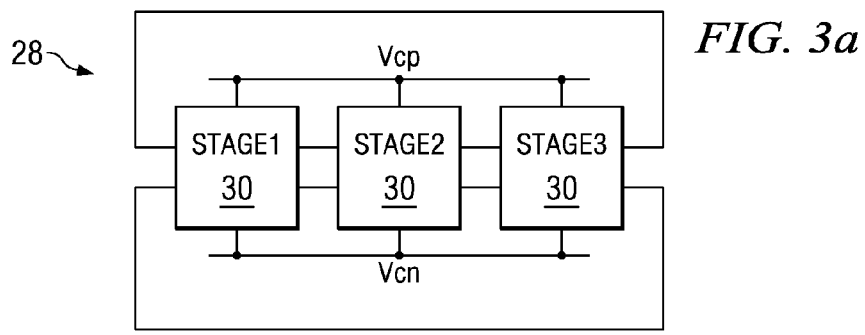
FIG. 3a is a block diagram of the VCO consisting of multiple identical delay stages each having differential control signals.
Figure 3B:
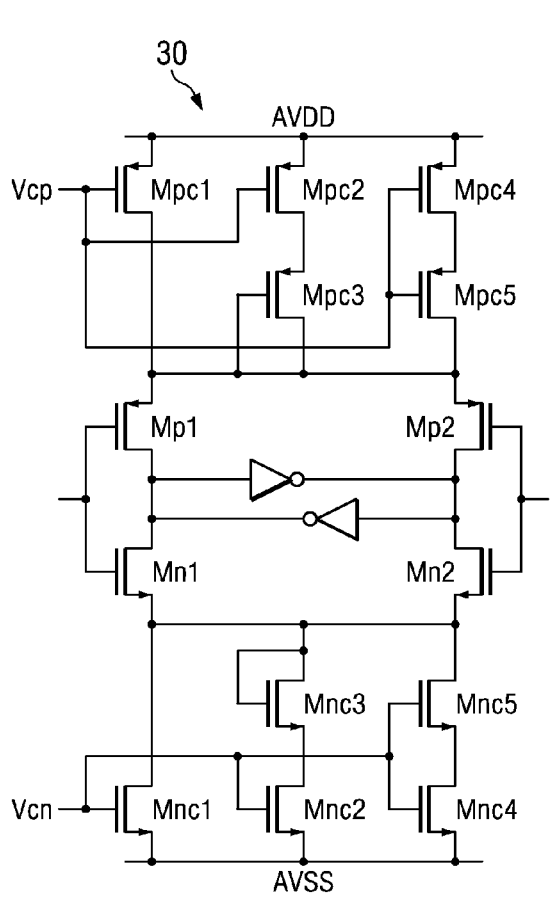
FIG. 3b is an electrical schematic diagram of one delay stage shown in FIG. 3a according to the present invention.
Figure 3C:
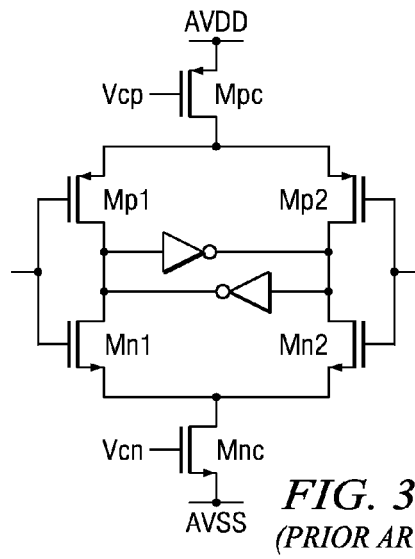
FIG. 3c is a schematic diagram of a prior art delay stage.

The VCO core 28 consists of three identical delay stages 30 according to the present invention, as shown in FIG. 3a. The delay stage 30, detailed in FIG. 3b, is similar, but not identical, to the delay stage mentioned by L. Dai and R. Harjani ('Design of High Performance CMOS VCO's'), shown in FIG. 3c. The control signals provided to each delay stage 30 are differential, with one control signal Vcp provided to transistor Mpc1-5, and one control signal Vcn provided to transistor Mnc1-5. The VCO sensitivity (in Hz/V or Rad/sec/volt) is a function of the transconductances and currents through transistors Mpc1-5, Mnc1-5, Mn1, Mn2, Mp1 and Mp2. Advantageously, the new delay circuit 30 makes the VCO 22 sensitivity almost constant across the interested frequency range.

FIG. 3b shows how the differential control voltage (Vcp-Vcn) is fed to the VCO 22. Advantageously, the positive control voltage, Vcp, is referenced to AVDD, not AVSS. This arrangement is different from the arrangement presented by L. Dai and R. Harjani shown in FIG. 3c, where both Vcp and Vcn are referenced to AVSS. The advantageous effect of this new arrangement is an improved power supply rejection of the VCO and less sensitivity to voltage regulator output noise.

The effect of transistor Mnc5 and transistor Mpc5 is reduced VCO sensitivity, while maintaining a high frequency range. Transistor Mnc1 and transistor Mpc1 are triode resistors with high effective transconductances. The effects of transistor Mnc3 and transistor Mpc3 is reduced drain-source voltages across transistor Mnc2 and transistor Mpc2 as the gate-source voltages of transistor Mnc2 and transistor Mpc2 go up, hence making transistor Mnc2 and transistor Mpc2 constant current sources. This helps to reduce VCO sensitivity. The combinations of transistors Mnc5, Mnc4 and Mpc5, Mpc4 effectively create high resistance, low transconductance structures.

The common mode voltage of the differential control to the VCO (Vcp and Vcn in FIG. 3b) is very important, as too high or too low a common mode voltage will cause the contribution of the PMOS and NMOS control transistors not to be equal, defeating the purpose of having a differential circuit. The common mode reference generator circuit generates a voltage which tracks supply and transistor parameters. This reference circuit is input to the common mode feedback circuit of the charge pump 14. The outputs of the charge pump are the differential input to the VCO.

Figure 4:
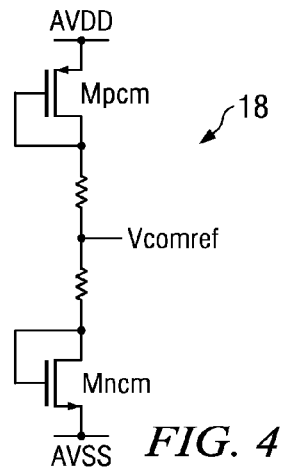
FIG. 4 is an electrical schematic representation of the common mode reference generator circuit.

FIG. 4 shows a common mode reference generator circuit in which the voltage tracks the supply, as well as transistor parameters. The common mode reference output tracks variations in mobility, threshold and supply.

Figure 5:
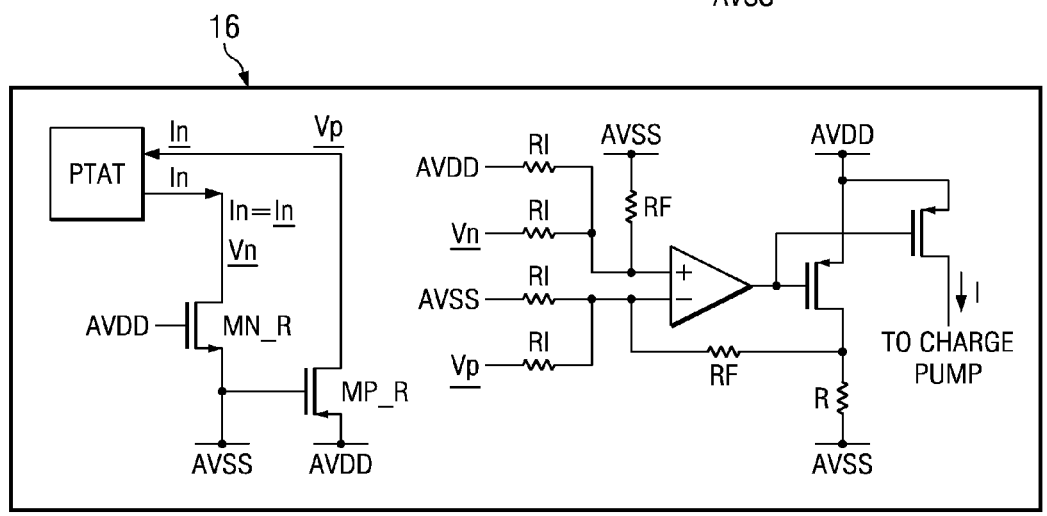
FIG. 5 is an electrical schematic diagram of the charge pump current generator, which inversely tracks the sensitivity (in MHz/V) of the VCO.

Referring now to FIG. 5, the charge pump generator 16 is shown as a block diagram. Generator 16 receives an input current I_IN (In and Ip) and outputs a current ICP (I in FIG. 5). The current ICP is a function of the process parameters of transistors MP_R, MIN_R (mobility, threshold). Current I_IN is generated from a PTAT current source generator. This is a very standard well known circuit and the current generated by such a source can be usually expressed as:

$$I_{IN} = \frac{kT}{qR_T} \ln \frac{A_2}{A_1} \quad (3)$$

where A2/A1 is the ratio of the areas of two BJT's and $R_T$ is a resistor which may have a positive or negative temperature coefficient.

$I_{CP}$ can be expressed as:

$$I_{CP} = \frac{RF}{RI}(V_P + A_{VDD} - A_{VSS} + V_n)\frac{1}{R} \quad (4)$$

AVDD and AVSS are the positive and negative supply terminals, respectively. AVDD-$V_P$ and $V_N$-AVSS are functions of current I-IN and the resistances of transistors MP_R and MN_R, respectively. The resistances are functions of the mobilities and threshold voltages, and the gate-to-source voltages. The gate-source voltage of transistor MN_R is equal to the source-gate voltage of transistor MP_R, and is equal to AVDD-AVSS. This is not an issue since typically AVDD is generated by a voltage regulator whose output voltage depends on a bandgap circuit generated voltage. This is, to a first order, independent of CMOS process parameters. The ratio RF/RI is process independent and depends only on layout matching.

Two types of variations must be accounted for:
(a) NMOS and PMOS process variations.
(b) NMOS and PMOS temperature variations.

With regards to mobility, with a decrease in mobility, the transconductance of the input pairs in the stages of the VCO decrease (Mp2 and Mn2), along with the effective transconductance of control transistors Mpc5 and Mnc5, decreasing VCO sensitivity, but the resistance of the transistors (MP_R and MN_R) of the charge pump current generator increases, and the current increases. Similarly, with an increase in threshold voltage, the transconductances and currents through transistors Mnc, Mpc, Mn1-2 and Mpl-2 decrease, but the resistances of transistors MP_R and MN_R increase.

The overall effect is that the produce $I_{CP}*K_{VCO}$ is less sensitive to process variations. A judicious selection of resistor components with emphasis on the temperature sensitivity is made for the resistors in the PTAT cell and current generator cell so that with temperature the current will track the VCO sensitivity.

Simulation Results:

Phase Noise simulations: Phase noise simulations in which the supply to the VCO 22 comes from a custom designed voltage regulator were done. In one simulation, both Vcp is referenced with respect to AVDD (regulator output) and Vcn is referenced with respect to AVSS. The simulated phase noise @ 384 kHz offset is −107.8 dBc/Hz. This result is much better than other architectures involving the single ended control of a VCO with same power consumption.

In another simulation (for comparison), Vcp was referenced with respect to AVSS (similar to the filter arrangement presented in ('Design of High Performance CMOS VCO's')). The simulated Phase noise@ 384 kHz offset is −103.7 dBc/Hz. This demonstrates the advantage of referencing one set of filter components to AVDD.

In comparison, the filter architecture of the present invention has a 4 dB improvement in terms of phase noise. The simulation results also show that the delay cell 30 has less variation in terms of VCO sensitivity across the frequency 100 MHz to 275 MHz, compared to the existing delay cell shown in FIG. 3c.

Closed Loop Bandwidth (KVCO*ICP):

As mentioned before, for the closed loop bandwidth, the product of KVCO and ICP is examined. Simulations were done for different process corners and temperatures. The frequency range is from 100 MHZ to 275 MHZ.

A DC simulation was done to extract the charge pump current. Transient simulations on the VCO 22 were done to extract sensitivity. The key parameter of importance is the product of the charge pump current and VCO sensitivity. The simulation results are summarized in Table 1 below:

TABLE 1

| Process Corner | Temperature | KVCO, MHz/V | ICP, uA | KVCO*ICP, Hz/Ohm |
|---|---|---|---|---|
| Nominal | 27 | 236 | 111 | 26196 |
| n strong p strong | 27 | 242 | 96 | 23222 |
| n weak, p weak | 27 | 203 | 124 | 25131 |
| Nominal | 115 | 171 | 136 | 23400 |
| Nominal | −20 | 275 | 95 | 26122 |

As can be seen in Table 1, there is only a 12% change in $K_{VCO}*I_{CP}$ across the simulated process corners.

In summary, PLL 10 achieves a higher performance than existing PLL architectures. PLL 10 achieves high dynamic range up to at least 110 dB, has a constant bandwidth and damping factor in an analog charge pump PLL, such that a PWM class-D amplifier is realizable with this PLL 10.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A phase locked loop (PLL) circuit, comprising:
a charge pump generating a current;
a differential loop filter coupled to the charge pump and having outputs;
a voltage controlled oscillator (VCO) having transistors receiving differential control inputs from the loop filter outputs;
wherein the VCO receives supply voltages AVDD and AVSS, wherein one of the differential control inputs is directly coupled to AVDD only through a first portion of the differential loop filter, and the other differential control input is directly coupled to AVSS only through a second portion of the differential loop filter.

2. The phase locked loop as specified in claim 1 wherein the differential control inputs comprise a positive control input and a negative control input, wherein the positive control input is referenced to AVDD, and the negative control input is referenced to AVSS.

3. The phase locked loop as specified in claim 1 wherein the charge pump generates a charge pump current $I_{CP}$, the VCO has a VCO frequency sensitivity $K_{VCO}$, wherein the product $K_{VCC}*I_{CP}$ is substantially independent of process and temperature variations.

4. The phase locked loop as specified in claim 1 wherein the PLL has low variations in closed loop bandwidth across process corners and temperature.

5. The phase locked loop as specified in claim 1 wherein the charge pump is an analog charge pump.

6. The phase locked loop as specified in claim 1 wherein the loop filter is external of the VCO.

7. The phase locked loop as specified in claim 1 wherein the VCO has multiple identical delay stages.

8. The phase locked loop as specified in claim 7 wherein each of the delay stages are a differential delay stage.

9. The phase locked loop as specified in claim 8 wherein each of the delay stages are comprised of triode resistors with high effective transconductances.

10. The phase locked loop as specified in claim 1 wherein the PLL has a common mode reference generator circuit generating a common mode voltage tracking one of the supply voltages and the VCO transistor parameters.

11. The phase locked loop as specified in claim 10 wherein the common mode voltage tracks variations in VCO mobility and threshold.

12. The phase locked loop as specified in claim 1 wherein the PLL has a phase noise less than about 107 dBc.

13. The phase locked loop as specified in claim 12 wherein the phase noise is established at about a 384 KHZ offset.

14. The phase locked loop as specified in claim 3 wherein there is less than a 12% change in the product $K_{VCO}*I_{CP}$ across process corners of the PLL.

* * * * *